(12) United States Patent
Stice

(10) Patent No.: US 6,332,973 B1
(45) Date of Patent: Dec. 25, 2001

(54) CMOS CHEMICAL BATH PURIFICATION

(75) Inventor: James Clayton Stice, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/490,465

(22) Filed: Jan. 25, 2000

(51) Int. Cl.$^7$ ............................... C25C 1/12; C25C 7/06
(52) U.S. Cl. ..................... 205/772; 205/574; 204/275.1; 204/276
(58) Field of Search .................. 205/772, 574; 204/275.1, 276

(56) References Cited

U.S. PATENT DOCUMENTS 4,187,166 * 2/1980 Kruper .................................. 205/772
4,595,451 * 6/1986 Holzer .................................. 205/772

FOREIGN PATENT DOCUMENTS

355049187 * 4/1980 (JP) .

* cited by examiner

Primary Examiner—Arun S. Phasge

(57) ABSTRACT

CMOS processing is enhanced via a method and system that use a chemical bath purification process. According to an example embodiment of the present invention, solution from a CMOS wet chemical bath is passed over a powered circuit. The powered circuit plates out copper from the solution, and the solution is then returned to the bath. By removing copper from the chemical bath in this manner, cross-contamination of wet chemical equipment is reduced, and the need for redundant tool sets can be eliminated.

19 Claims, 2 Drawing Sheets

CMOS CHEMICAL BATH PURIFICATION

FIELD OF THE INVENTION

The present invention relates generally to semiconductor devices and their fabrication and, more particularly, to semiconductor devices and their manufacture involving techniques for the purification of copper-contaminated chemical baths used in CMOS processing.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second, to be packaged in relatively small, air-cooled semiconductor device packages. Related to the technological advances in the semiconductor industry is a corresponding growth in the use of such technology in virtually every aspect of the economy. This widespread growth has led to a demand for heightened production of semiconductor devices having increasingly complex architecture, as well as a heightened demand for providing access to such technologies for a large portion of the general public at an affordable price.

The increasing demand for products utilizing semiconductor technology has resulted in increased competition among manufacturers of semiconductor products. One of the biggest challenges to semiconductor manufacturers includes the production of reliable, complex devices while keeping costs at a marketable or even reduced level. As technology advances and architecture becomes more complex, the manufacturing processes for semiconductor devices and integrated circuits increase in difficulty. The increase in difficulty is accompanied by increased time and value put into the manufacture of the devices. The ability to achieve the manufacture of such devices in an efficient and cost-effective manner is paramount to the success of any semiconductor device manufacturer and to the promulgation of products employing new technologies at an affordable price.

One semiconductor manufacturing system that is typically used in semiconductor processing, such as for CMOS devices, is a wet chemical bath. One problem associated with wet chemical baths is the copper cross-contamination of the wet chemical equipment. Copper existing in the wet chemical solution tends to contaminate the tools, often requiring redundant tool sets. The requirement of redundant tool sets increases the cost of the manufacturing process. The difficulty, cost, and destructive aspects of existing methods for CMOS wet chemical processing are impediments to the growth and improvement of semiconductor technologies.

SUMMARY OF THE INVENTION

The present invention is directed to a method and system for cleaning chemical baths used in semiconductor processing, and is exemplified in a number of implementations and applications, some of which are summarized below.

According to an example embodiment of the present invention, copper-contaminated wet chemical bath solution is cleaned by plating out the copper from the solution in an electrowinning arrangement. The solution is passed from the chemical bath over a powered cathode and anode. The powered cathode and anode plate out the copper from the solution, and the solution is returned to the chemical bath. In this manner, cross-contamination of equipment used in wet chemical baths is reduced or even eliminated, reducing or eliminating the need for redundant tool sets.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
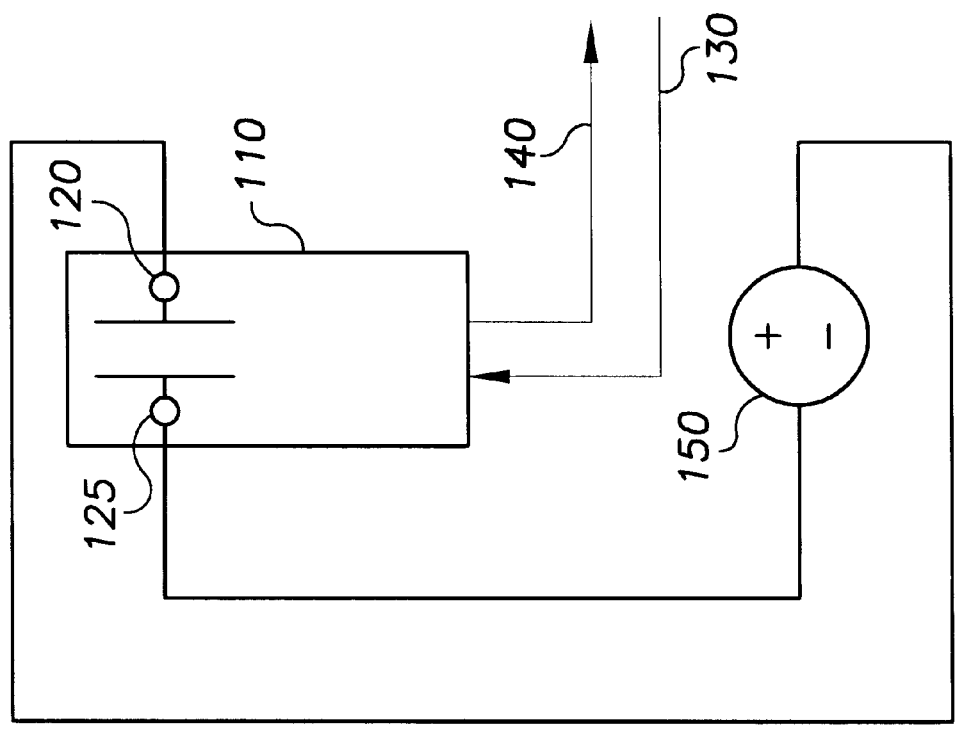
FIG. 1 is a wet chemical purification arrangement, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor wafers, and the invention has been found to be particularly suited for processing CMOS and other type wafers requiring or benefiting from wet chemical bath purification. While the present invention is not necessarily limited to such applications, various aspects of the invention may be appreciated through a discussion of various examples using this context.

Wet chemical processing is an integral part of CMOS wafer manufacturing. One aspect of the wet chemical manufacturing process that is particularly expensive is the replacement of tools and other related equipment due to copper cross-contamination. The present invention directly addresses the difficulties associated with copper cross-contamination in wet chemical processing. According to an example embodiment of the present invention, solution from a wet chemical bath is pumped from the bath and over a plating arrangement having an anode and a cathode. The anode and cathode are powered at about 0.5 volts, and copper is plated out of the solution. The solution is returned to the chemical bath and used in further processing. This purification process may take place during semiconductor processing, or may be performed when the chemical bath is not being used for processing.

FIG. 1 is an example system 100 for plating out copper from a wet chemical bath solution. The solution is delivered via a fluid supply line 130 to a plating arrangement 110 having an anode 120 and a cathode 125. The anode 120 and cathode 125 are powered via a power supply 150 at a voltage of about 0.5 volts. Copper is plated out of the solution at the plating arrangement 110, and the solution is returned to the chemical bath via fluid return line 140.

In another example embodiment of the present invention, a separate plating loop is used in combination with a filter arrangement and a plating arrangement having an anode and a cathode. Chemical bath solution is pumped from a chemical bath to the filter arrangement. The filter arrangement is connected via fluid lines to a plating pump and the plating arrangement having an anode and a cathode. The solution passes into the filter arrangement, is pumped through the plating arrangement via the recycle pump, returned to the filter arrangement, and delivered back to the chemical bath.

Figure 2:
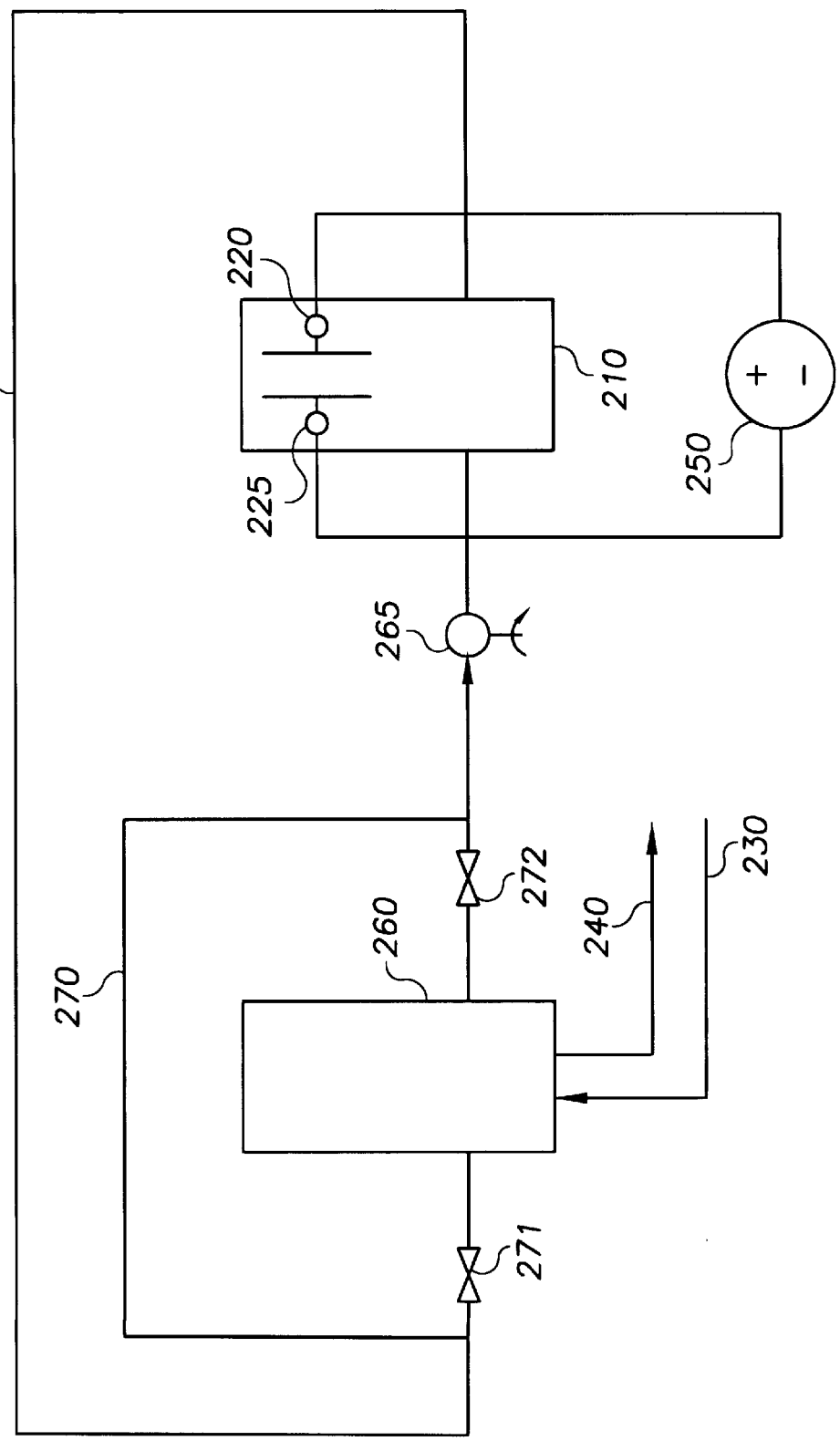
FIG. 2 is another wet chemical purification arrangement, according to another example embodiment of the present invention.

FIG. 2 shows a chemical bath purification system 200 having such a plating loop 280, according to an example embodiment of the present invention. FIG. 2 also shows an optional recycle loop 270, according to another example embodiment of the present invention. First, the process not using the recycle loop 270 is described. Wet chemical processing solution is pumped from a wet chemical bath to a filter arrangement 260 via fluid supply line 230. The solution enters the filter arrangement 260 and is pumped to a plating arrangement 210 via a plating pump 265. The plating arrangement 210 has an anode 220 and a cathode 225 coupled to a power supply 250. The power supply 250 is used to supply about 0.5 volts to the anode and cathode, and copper is plated out of the solution. The solution is then returned to the filter arrangement 260 via the plating loop 280, and is returned to the chemical bath from the filter arrangement 260 via fluid return line 240.

The optional recycle loop provides the ability to recycle the solution to the plating arrangement prior to returning it to the chemical bath. For example, this may be useful for achieving a greater reduction of copper in the solution. The optional recycle loop works as follows: Wet chemical solution is delivered to the filter arrangement 260 and the plating arrangement 210 as described in the above paragraph. Once the solution is pumped into the plating loop 280, valve arrangements 271 and 272 are closed, bypassing the filter arrangement via the recycle loop 270. Valve arrangements 271 and 272 may, for example, include three-way valves coupled to direct the solution either to the filter arrangement 260 or to the recycle loop 270, or may include a combination of two-way valves. The plating pump 265 is used to recycle the solution through the plating arrangement 210. The amount of time that the solution is recycled depends upon the desired amount of copper plating that is desired, and can he determined as a function of the wet chemical process and the amount of copper that is in the solution. After the solution has been sufficiently purified, the valves 271 and 272 are opened, and the solution returns to the filter arrangement 260, and is delivered back to the wet chemical bath.

In another example embodiment, the purification system may include a programmable controller, such as a computer, adapted to control the function of the system. For example, a programmable controller can be programmed to turn on a pump to the purification system, deliver solution to the system, and activate the power supply to the anode and cathode arrangement. When a separate plating loop is controlled, or when a recycle loop is controlled, the controller is also coupled to control other functions of the process, such as the operation of the plating pump 265 and the valve arrangements 271 and 272.

The programmable controller can also be used to control the amount of time that the solution is passed through the recycling loop. Such control of the recycling time can be pre-programmed into the controller, or can be a function of the process at hand, such as by detecting the amount of copper in the solution and determining when the amount is below a particular threshold.

While the present invention has been described with reference to several particular example embodiments, those skilled in the art will recognize that many changes may be made thereto without departing from the spirit and scope of the present invention, which is set forth in the following claims.

What is claimed is:

1. A method for purifying a CMOS processing chemical bath, the method comprising:
passing solution from the chemical bath over a powered circuit and through a filter arrangement;
plating out copper from the solution via the powered circuit; and
returning the solution to the chemical bath.

2. The method of claim 1, wherein the circuit is powered at about 0.5 volts.

3. The method of claim 1, wherein the solution from the chemical bath is passed over the powered circuit while the chemical bath is being used for CMOS processing.

4. The method of claim 1, wherein plating out copper includes electrowinning.

5. The method of claim 1, wherein the powered circuit is located in the filter arrangement.

6. The method of claim 1, wherein the powered circuit is located in a recycle loop coupled to the filter arrangement, and wherein passing solution from the chemical bath over a powered circuit includes passing the solution through the recycle loop.

7. The method of claim 6, wherein passing the solution through the recycle loop includes pumping the solution via a pump located in the recycle loop.

8. The method of claim 1, wherein the powered circuit includes a cathode and an anode.

9. A method for purifying a CMOS processing chemical bath, the method comprising:
supplying a filter arrangement;
supplying a first fluid line from the bath to the filter arrangement and back to the bath;
supplying a first pump coupled to the first fluid line and adapted to draw solution from the chemical bath, deliver the solution to the filter arrangement, and return the solution to the chemical bath;
supplying a fluid recycle loop coupled to the filter arrangement and having a second fluid line, a second pump, a cathode, an anode, and a power supply coupled to the cathode and anode;
using the first fluid line and the first pump, delivering the CMOS chemical bath solution to the filter arrangement;
using the second fluid line and the second pump, recycling the delivered CMOS chemical bath solution through the fluid recycle loop;
supplying power via the power supply to the anode and cathode and plating out copper in the solution at the recycle loop; and
returning the solution to the CMOS processing chemical bath.

10. A system for purifying a CMOS processing chemical bath, the system comprising:
means for plating out copper from the bath;
means for filtering the solution; and
means for delivering solution to the means for plating out copper from the solution and to the means for filtering the solutions, and returning the solution to the bath from the means for plating out copper.

11. A system for purifying a CMOS processing chemical bath having a solution, the system comprising:

a filter arrangement;

a circuit coupled to a power supply and adapted to plate out copper from a solution;

a first fluid line extending from the chemical bath to the filter arrangement;

a second fluid line extending from the filter arrangement to the chemical bath; and a first pump adapted to pump the solution to through the filter arrangement and over the circuit via the first and second fluid lines.

12. The system of claim 11, wherein the filter arrangement includes the circuit.

13. The system of claim 11, further comprising a fluid recycle loop coupled to the filter arrangement, wherein the fluid recycle loop includes the circuit.

14. The system of claim 13, wherein the fluid recycle loop further comprises:

a second pump adapted to draw the solution from the filter arrangement, over the circuit, and back to the filter arrangement.

15. The system of claim 14, further comprising a valve arrangement coupled to the recycle loop and adapted to maintain the fluid in the recycle loop.

16. The system of claim 15, further comprising a programmable controller adapted to control the pumps, the valve arrangement, and the circuit.

17. The system of claim 16, wherein the programmable controller is programmed to:

use the first pump and deliver solution to the filter arrangement from the chemical bath via the first fluid line;

draw the solution to the recycle loop from the filter arrangement via the second pump;

actuate the valve arrangement and maintain the solution in the recycle loop;

supply power to the cathode an anode and plate copper out of the solution in the recycle loop;

subsequent to plating out the copper, actuate the valve arrangement to release the solution from the recycle loop; and use the first pump and return the solution from the filter arrangement to the chemical bath.

18. The system of claim 11, further comprising a programmable controller.

19. The system of claim 11, wherein the circuit includes a cathode and an anode.

* * * * *

UNITED STATES PATENT AND TRADEMARK OFFICE
CERTIFICATE OF CORRECTION

PATENT NO.  : 6,332,973 B1  Page 1 of 1
DATED       : December 25, 2001
INVENTOR(S) : Stice It is certified that error appears in the above-identified patent and that said Letters Patent is hereby corrected as shown below:

Column 4,
Line 64, "solutions," should read -- solution, --.

Signed and Sealed this

Fourth Day of June, 2002

Attest:

Attesting Officer

JAMES E. ROGAN
*Director of the United States Patent and Trademark Office*